United States Patent
Nitta

(10) Patent No.: US 6,504,440 B2
(45) Date of Patent: Jan. 7, 2003

(54) DIELECTRIC RESONANCE OSCILLATION CIRCUIT

(75) Inventor: Hitoshi Nitta, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/773,600

(22) Filed: Feb. 2, 2001

(65) Prior Publication Data

US 2002/0033740 A1 Mar. 21, 2002

(30) Foreign Application Priority Data

Feb. 3, 2000 (JP) ........................................ 2000-026465

(51) Int. Cl.[7] ................................................ H03B 5/18
(52) U.S. Cl. ........................ 331/99; 331/96; 331/117 D
(58) Field of Search ............................. 331/96, 99, 100, 331/107 DP, 107 SL, 117 R, 117 FE, 117 D

(56) References Cited

U.S. PATENT DOCUMENTS

| | | | | |
|---|---|---|---|---|
| 4,565,979 A | * | 1/1986 | Fiedziuszko | ............ 331/117 D |
| 5,204,641 A | * | 4/1993 | Fiedziuszko et al. | ......... 331/96 |
| 2001/0019293 A1 | * | 9/2001 | Kose et al. | |

FOREIGN PATENT DOCUMENTS

| JP | 61-172412 | * | 8/1986 | |
|---|---|---|---|---|
| JP | 2-183606 | * | 7/1990 | |
| JP | A10200333 | | 7/1998 | |

OTHER PUBLICATIONS

Gardiol "Microstrip Circuits" *John Wiley & Sons* 1994 pp v,vi,1,6,7.*
Chang "Microwave Ring Circuits and Antennas" *John Wiley & Sons* 1996 pp 1–3.*
Lee et al "Microwave Devices, Circuits and Their Applications" *John Wiley & Sons* 1994 pp 39, 43.*
Karmel et al, "Introduction to Electromagnetic And Microwave Engineering" *John Wiley & Sons* 1998 pp 324–326.*
IEEE "Standard Dictionary of Electrical And Electronics Terms" *The Institute of Electrical And Electronics Engineers* 1984 pp. 546,547,895.*

* cited by examiner

*Primary Examiner*—David C. Mis
(74) *Attorney, Agent, or Firm*—Birch, Stewart, Kolasch & Birch, LLP

(57) ABSTRACT

In a feedback type oscillation circuit including a first microstrip line connected to a signal input terminal of a transistor, a second microstrip line connected to a signal output terminal of the transistor, and a dielectric resonator coupled with the microstrip lines at high frequency, the first and second microstrip lines are provided with patterns that are branched off from the respective microstrip lines, each at an arbitrary angle.

6 Claims, 4 Drawing Sheets

DIELECTRIC RESONANCE OSCILLATION CIRCUIT

BACKGROUND OF THE INVENTION

1. Field of the Invention

The present invention relates to a dielectric resonance oscillation circuit using a microstrip line, a dielectric resonator and a transistor.

2. Description of the Background Art

In a receiving converter for satellite broadcasting employing Ku-band, a local oscillation signal of extremely high frequency of 10 GHz to 12 GHz has been utilized. Correspondingly, it has become common for a local oscillation circuit to employ a field effect transistor (FET) having a high cutoff frequency (Ft).

FIG. 4 illustrates a pattern and parts arrangement of a dielectric resonance oscillation circuit utilizing such a FET. Specifically, a microstrip line 52 has one end connected to a gate terminal 58 of FET 51 and the other end grounded via a terminating resistance 53 of 50Ω. A dielectric resonator 4 is provided at an appropriate distance maintained from microstrip line 52 within a range where it can be coupled with microstrip line 52 at high frequency. With such an arrangement, a change in location of dielectric resonator 4 is accompanied by a change in impedance of dielectric resonator 4 as seen from gate terminal 58.

The oscillation circuit above comes to operate for oscillation when the impedance of dielectric resonator 4 as seen from a source terminal 59 of FET 51 exhibits characteristics of negative resistance. As dielectric resonator 4 is moved in parallel with microstrip line 52, at the time when it arrives at a specific position, the impedance of dielectric resonator 4 seen from source terminal 59 attains such characteristics of negative resistance. Thus, by properly positioning the dielectric resonator 4, a stable oscillating operation is ensured. A signal generated by such an oscillating operation is output from source terminal 59. The oscillation signal is then externally taken out from an oscillation signal output terminal 57, via a stub 55 for output matching and a capacitor 56 for removal of a direct-current (DC) component. In FIG. 4, 60 denotes a DC supply terminal.

The characteristics of negative resistance as described above exhibit periodicity in that they appear every time dielectric resonator 4 moves a distance equal to a wavelength of the oscillation frequency. If dielectric resonator 4 is placed close to FET 51, the loops of the electric field generated from dielectric resonator 4 strongly affect FET 51, thereby increasing phase noise. Thus, dielectric resonator 4 is placed as far as possible from FET 51 within a range allowed by a size of an enclosure containing the oscillation circuit.

Currently, however, there is a pressing demand for increasing an amount of transmissible data for the Internet, for two-way communications, and in the fields where multi-channel and/or high-definition broadcasting is pursued, e.g., for digital broadcasting by broadcast-satellite (BS) that has recently been introduced to Japan. To meet such a demand, there is a growing tendency to employ 8-value PSK (phase shift keying) as a modulation technique, instead of 4-value PSK.

When such transition from 4-value PSK to 8-value PSK takes place, however, a permissible level of phase rotation in a signal transmission path becomes small. Accordingly, in the specification of a block handling a signal of high frequency, a permissible level of phase noise is set to a small value.

More specifically, in the phase shift keyed modulation techniques, data are identified by phase distribution on a complex plane. Thus, tolerance for phase variation for the 8-value PSK becomes much narrower than that for the 4-value PSK. When performing frequency conversion in the block handling a signal of high frequency, a local oscillation signal is required. Such a local oscillation signal includes undesired phase noise, which causes deviation of the phase distribution of the modulated signal being transmitted. Accordingly, for the frequency conversion of a signal by the 8-value PSK, a signal of low phase noise should be used as the local oscillation signal.

If FET 51 is being used as an oscillation element, it is difficult to decrease the phase noise, since undesired phase noise included in the oscillation signal tends to increase. Thus, a technique has been proposed which employs PLL (phase locked loop) to decrease such undesired phase noise. In order to use this technique, however, a reference signal oscillation circuit employing a temperature compensated type crystal oscillator will be required. Such a reference signal oscillation circuit is expensive, which makes this technique difficult to apply to household appliances.

A technique to address the above-described problems associated with the local oscillation circuit in the converter has conventionally been disclosed in Japanese Patent Laying-Open No. 10-200333.

Specifically, this technique utilizes, as an oscillation element, a transistor that operates in a microwave band. A circuit disclosed therein includes a microwave line connected to a base terminal of the transistor, and a dielectric resonator configured to couple with this microwave line. The microwave line has a length equal to ½ the wavelength of an oscillation frequency and its end is open-circuited. Alternatively, the microwave line may have a length equal to ¼ the wavelength or an odd number of times thereof and its end is short-circuited. The resonance frequency of the dielectric resonator is set equal to the oscillation frequency.

This reference, however, has not disclosed any specific arrangements for interconnecting a plurality of patterns or any specific configurations for achieving stable oscillation. Thus, an attempt to realize a compact oscillation circuit for practical use according to this technique has encountered a number of obstacles.

SUMMARY OF THE INVENTION

An object of the present invention is to provide a dielectric resonance oscillation circuit that facilitates configuration of a feedback type oscillation circuit.

Another object of the present invention is to provide a dielectric resonance oscillation circuit that increases the degree of freedom in pattern designing.

A further object of the present invention is to provide a dielectric resonance oscillation circuit that makes a stable oscillation output obtainable.

A still further object of the present invention is to provide a dielectric resonance oscillation circuit that exhibits an increased degree of coupling with a dielectric resonator.

Yet another object of the present invention is to provide a dielectric resonance oscillation circuit that facilitates supply of power.

A further object of the present invention is to provide a dielectric resonance oscillation circuit that decreases a leakage level of an oscillation signal.

A still further object of the present invention is to provide a dielectric resonance oscillation circuit that facilitates taking of an output signal.

Yet another object of the present invention is to provide a dielectric resonance oscillation circuit that prevents a DC component from appearing at an outputting terminal.

A further object of the present invention is to provide a dielectric resonance oscillation circuit that decreases an effect of a circuit connected to the outputting terminal being posed on oscillation.

The dielectric resonance oscillation circuit according to an aspect of the present invention includes: a microstrip line connected to a signal input terminal of a transistor; a microstrip line connected to a signal output terminal of the transistor; and a dielectric resonator coupled with the microstrip lines at high frequency. Each of the microstrip lines is provided with a pattern that is branched off from the relevant microstrip line at an arbitrary angle.

Accordingly, it is readily possible to realize an arrangement in which the microstrip line connected to the signal output terminal is coupled to the dielectric resonator at high frequency and, at the same time, the dielectric resonator is coupled to the microstrip line connected to the signal input terminal at high frequency. In other words, a feedback path via the dielectric resonator can readily be configured.

Preferably, the pattern branched off from the microstrip line is provided with another pattern that is branched off from that pattern at an arbitrary angle.

Accordingly, the resulting angle between the pattern branched off from the microstrip line and the pattern branched off from that pattern can be set to any angle according to the design requirement.

Preferably, the microstrip line connected to the signal input terminal of the transistor and the microstrip line connected to the signal output terminal of the transistor each have its end open-circuited. The microstrip lines are both coupled to the dielectric resonator at high frequency.

Accordingly, a feedback path is formed through which a signal output from the signal output terminal of the transistor is guided via the dielectric resonator to the signal input terminal of the transistor. Thus, the transistor operates as a feedback type oscillation circuit.

Preferably, the microstrip line has a shape curved corresponding to the shape of the dielectric resonator.

Thus, by making the shape of the microstrip line correspond to that of the dielectric resonator, it is possible to increase the degree of coupling between the microstrip line and the dielectric resonator at high frequency.

Preferably, a direct current is supplied at an end of the pattern branched off from the microstrip line.

This pattern branched off from the microstrip line serves to prevent the DC supplying circuit from affecting the microstrip line.

Preferably, a stub is provided at an end of the branched pattern, which hinders passage of the oscillation signal.

Accordingly, leakage of the oscillation signal to the DC supplying circuit is prevented.

Preferably, the dielectric resonance oscillation circuit has a pattern that is branched off from the microstrip line in the vicinity of a connect point between the microstrip line and the signal output terminal of the transistor. The oscillation signal is taken out from an outputting end of the branched pattern that corresponds to its end opposite to the branched end.

Accordingly, the pattern branched off from the microstrip line prevents a load connected to the outputting end from affecting the connect point between the microstrip line and the signal output terminal.

Preferably, a capacitor is connected between the outputting end and the oscillation signal output terminal.

This capacitor hinders passage of a DC component.

Preferably, an attenuator is provided between the outputting end and the oscillation signal output terminal.

This attenuator serves to decrease an effect of a load connected to the oscillation signal output terminal being posed on the outputting end.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

Figure 1:
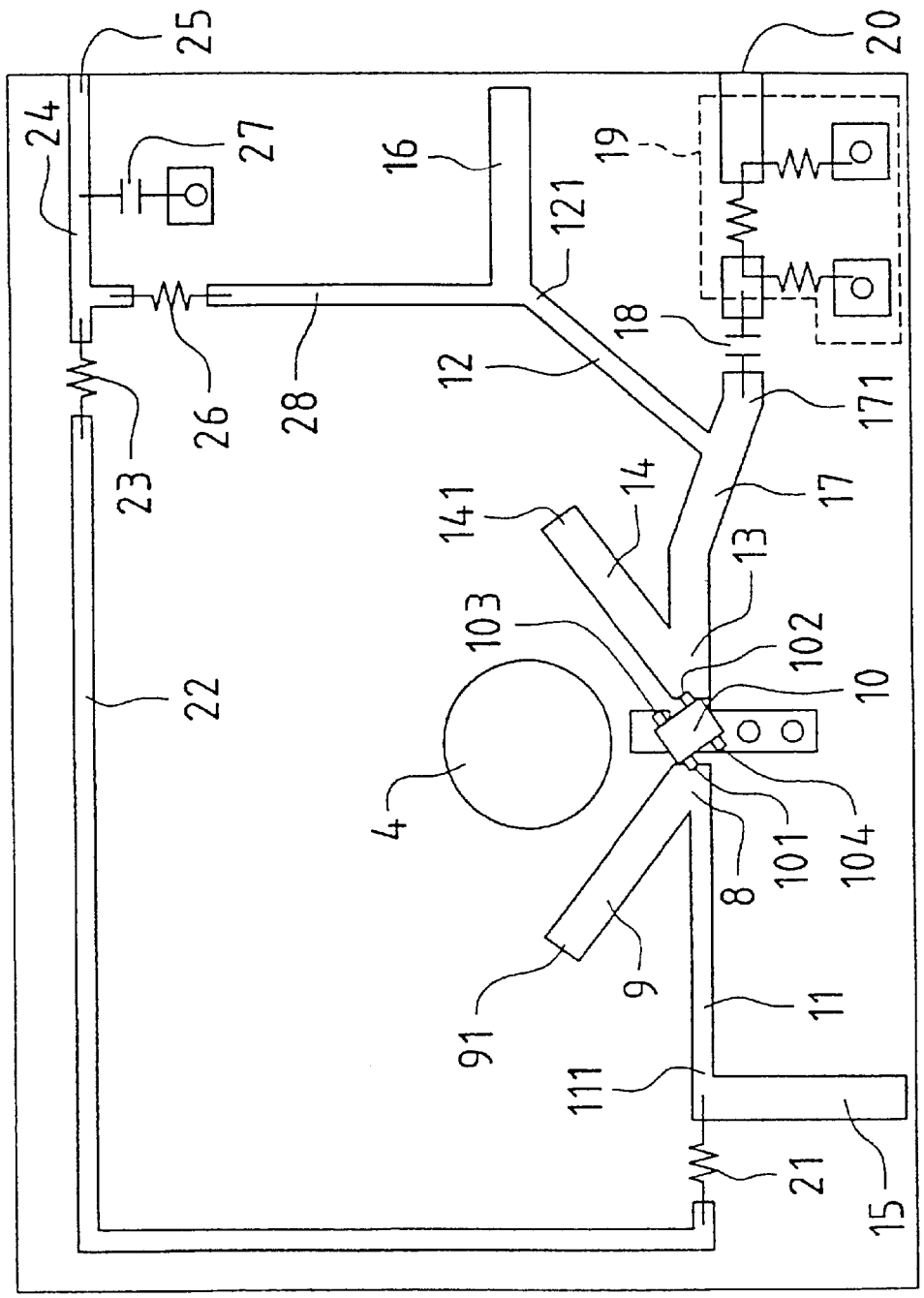
FIG. 1 illustrates a pattern and element arrangement of a dielectric resonance oscillation circuit according to a first embodiment of the present invention.

Referring to FIG. 1 showing a configuration of the first embodiment, a silicon transistor (hereinafter, simply referred to as "transistor") 10 is an element having a cutoff frequency greater than 30 GHz. A base terminal (signal input terminal) 101 of transistor 10 is connected with a microstrip line 9 having its end 91 open-circuited.

A pattern 11 is provided which is branched off from microstrip line 9 at an arbitrary angle, at a branched portion 8 in the vicinity of a connect point between microstrip line 9 and base terminal 101. Pattern 11 has its pattern width narrower than that of microstrip line 9.

To an end 111 of pattern 11 branched off from microstrip line 9, a terminal of a resistance 21 is connected for application of a base bias to base terminal 101. The end 111 is provided with a stub 15 hindering passage of an oscillation signal, so that the oscillation signal is prevented from flowing into resistance 21.

The other terminal of resistance 21 is connected via a pattern 22 and a resistance 23 to a DC supplying pattern 24. An end 25 of the pattern 24 constitutes a DC supply terminal. A bypass capacitor 27 is connected between pattern 24 and a pattern for grounding.

A collector terminal (signal output terminal) 102 of transistor 10 is connected with a microstrip line 14, which has its end 141 open-circuited. Emitter terminals 103 and 104 of transistor 10 are grounded.

A pattern 17 is branched off from microstrip line 14 at an arbitrary angle, at a branched portion 13 in the vicinity of a connect point between microstrip line 14 and collector terminal 102. The pattern width of pattern 17 is approximately equal to the pattern width of microstrip line 14.

Of pattern 17 branched off from microstrip line 14, an end opposite to its branched end constitutes an outputting end 171. Outputting end 171 is connected with one terminal of a capacitor 18 that is provided for removal of a DC component. A π-type attenuator 19 is connected between the other terminal of capacitor 18 and an oscillation signal output terminal 20. The attenuator 19 is composed of three resistance elements.

Further, from pattern 17 branched off from microstrip line 14, another pattern 12 is branched off at an arbitrary angle with respect to pattern 17, at a position closer to outputting end 171 than to the branched end thereof This pattern 12 has its pattern width narrower than that of pattern 17.

Pattern 12 serves to supply a DC bias to collector terminal 102 of transistor 10 as its operating power. In order to prevent an oscillation signal from flowing towards a resistance 26, an end 121 of pattern 12, opposite to its branched end, is provided with a stub 16 that hinders passage of an oscillation signal.

This end 121 of pattern 12 is connected via a pattern 28 to one terminal of resistance 26. The other terminal of resistance 26 is connected to pattern 24.

Dielectric resonator 4 is an element whose resonance frequency is equal to the frequency being oscillated. Dielectric resonator 4 is provided at a position where it can be coupled with microstrip lines 9 and 14 both at high frequency.

Microstrip line 9 is configured to have a length that restricts coupling impedance between microstrip line 9 and dielectric resonator 4 to a sufficiently low level. Likewise, microstrip line 14 is configured to have a length that ensures sufficiently low coupling impedance between microstrip line 14 and dielectric resonator 4.

The operation of the first embodiment having a configuration as described above will now be described.

There exists a signal of thermal noise level within dielectric resonator 4 at room temperature. This noise signal repeats interfering reflection at a periphery of cylindrical shape of dielectric resonator 4. Accordingly, dielectric resonator 4 comes to vibrate at a specific frequency. A signal generated by such vibration or resonance is introduced into base terminal 101 of transistor 10 by way of coupling at high frequency between dielectric resonator 4 and microstrip line 9. The signal introduced into base terminal 101 is then amplified by transistor 10, and introduced into microstrip line 14.

The signal introduced into microstrip line 14 is transmitted by way of coupling at high frequency between microstrip line 14 and dielectric resonator 4 and enters dielectric resonator 4. Of the signal penetrated into dielectric resonator 4, a signal component of a specific frequency (resonance frequency) is exclusively emphasized by the resonance of dielectric resonator 4. The signal is then applied via microstrip line 9 to base terminal 101 of transistor 10.

In other words, a feedback type oscillation circuit is accomplished, wherein dielectric resonator 4 is positioned in the middle of a path through which a signal output from collector terminal 102 is introduced into base terminal 101. Thus, an oscillation signal whose frequency is equal to the resonance frequency of dielectric resonator 4 appears at collector terminal 102 of transistor 10.

The oscillation signal which appeared at collector terminal 102 of transistor 10 is sent via pattern 17, capacitor 18 and attenuator 19 to oscillation signal output terminal 20.

As mentioned above, outputting end 171 of pattern 17 is connected to this oscillation signal output terminal 20 via attenuator 19. Thus, even if a load at oscillation signal output terminal 20 varies, a stable condition is maintained for oscillation, not affected by such load variation.

In order to prevent the oscillation frequency from varying due to variation of temperature or humidity, the block for oscillation shown in FIG. 1 may be enclosed in an airtight container (e.g., a metal can).

Figure 3:
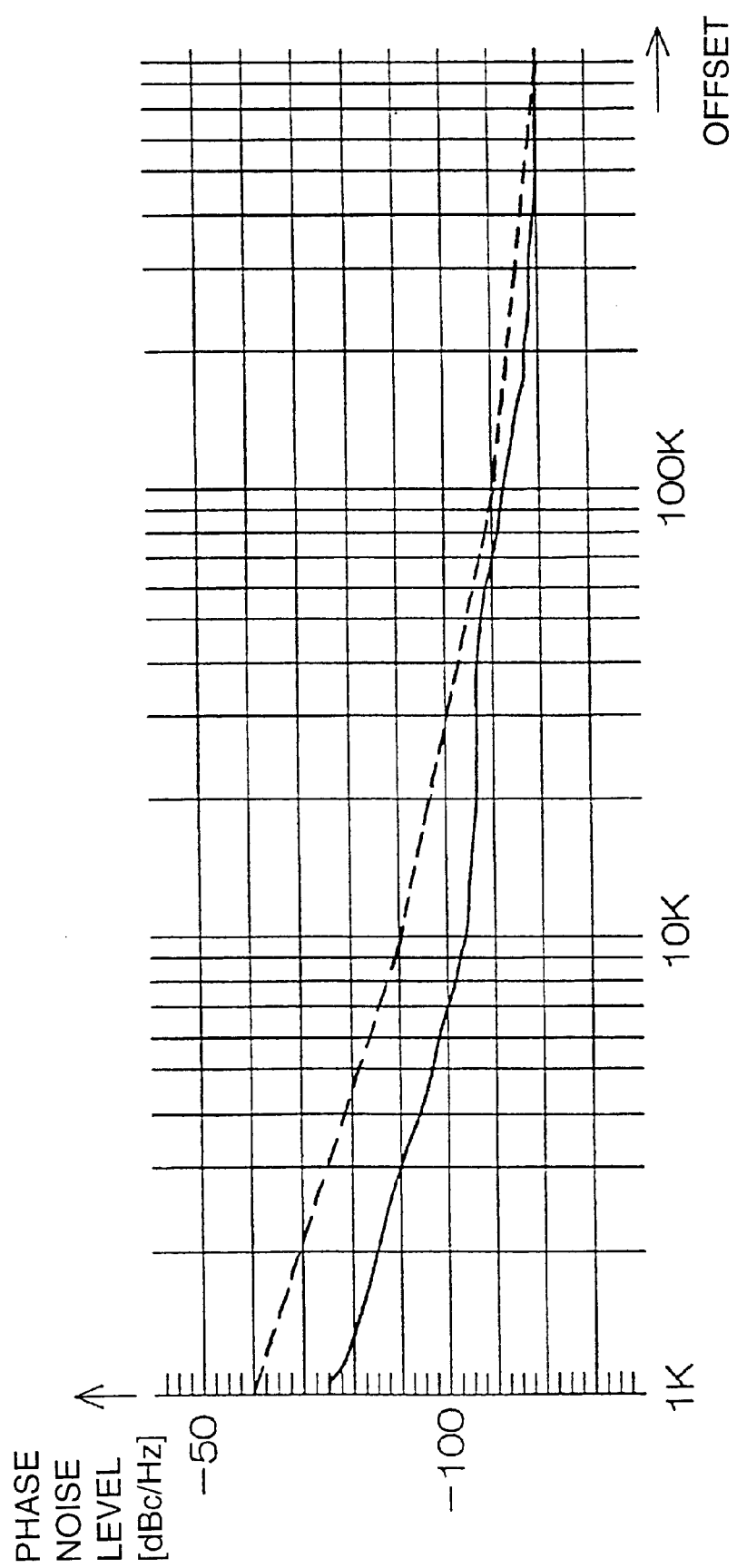
FIG. 3 shows phase noise, measured using a spectrum analyzer, of an oscillation signal obtained from an oscillation signal output terminal of the dielectric resonance oscillation circuit of the first embodiment when it was made to oscillate while being sealed in a can.

FIG. 3 illustrates phase noise of oscillation signals measured using a spectrum analyzer. The solid line represents the phase noise of an oscillation signal obtained at oscillation signal output terminal 20 of the first embodiment of the present invention, when the block was made to oscillate while being sealed within the can. The dotted line represents the phase noise obtained when the prior art as shown in FIG. 4 was utilized.

More specifically, the phase noise in the case of this invention, represented by the solid line, is approximately −75 dBc/Hz when the offset is 1 KHz, and it is approximately −103 dBc/Hz when the offset is 10 KHz. On the other hand, the phase noise in the case of the prior art shown in FIG. 4, represented by the dotted line, is approximately −60 dBc/Hz when the offset is 1 KHz, and is approximately −90 dBc/Hz when the offset is 10 KHz.

Thus, it can be said that the oscillation signal obtained by the first embodiment of the present invention has a higher purity compared with the signal obtained by the prior art, with its phase noise being considerably decreased.

Figure 4:
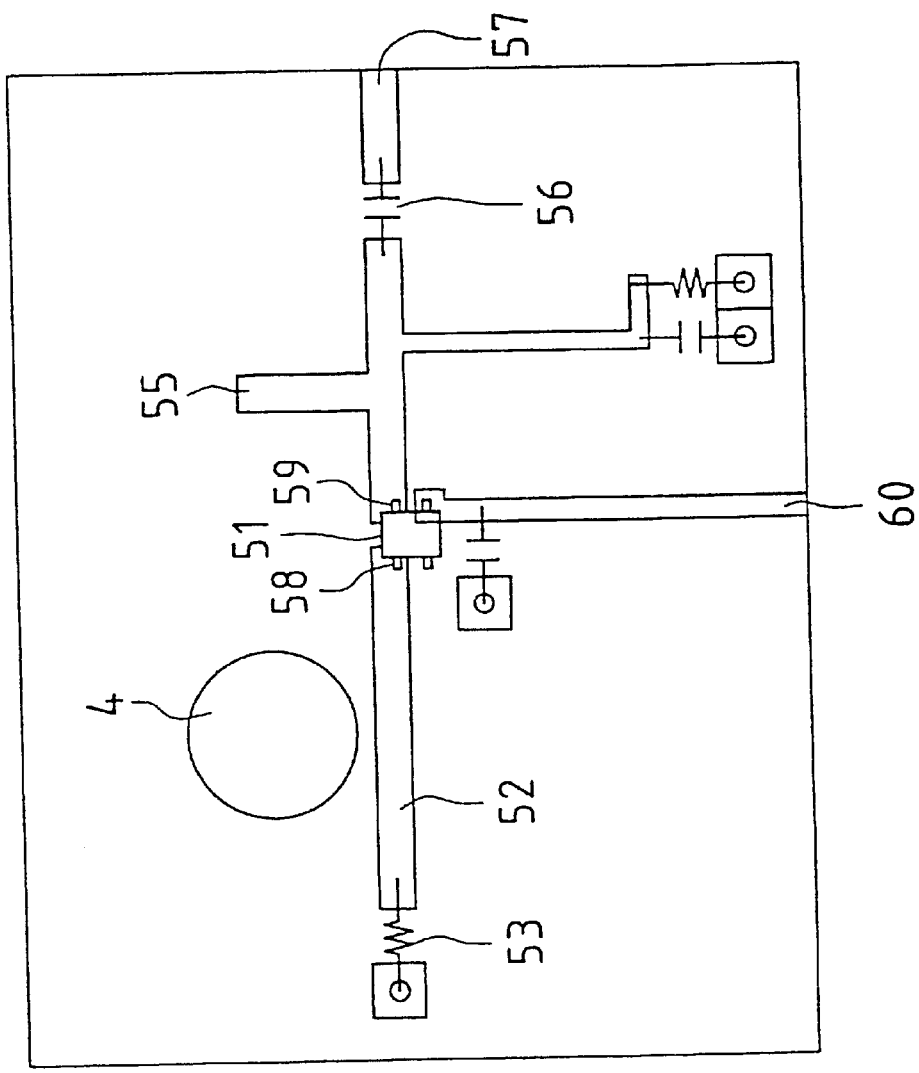
FIG. 4 illustrates a pattern and element arrangement of a conventional dielectric resonance oscillation circuit.

As explained above, the present embodiment constitutes a feedback type oscillation circuit, which differs in principle from a conventional, band reflected type oscillation circuit as of the configuration shown in FIG. 4 or disclosed, e.g., in Japanese Patent Laying-Open No. 10-200333. Thus, it becomes possible to increase the oscillation level as well as to further stabilize the oscillation frequency.

Figure 2:
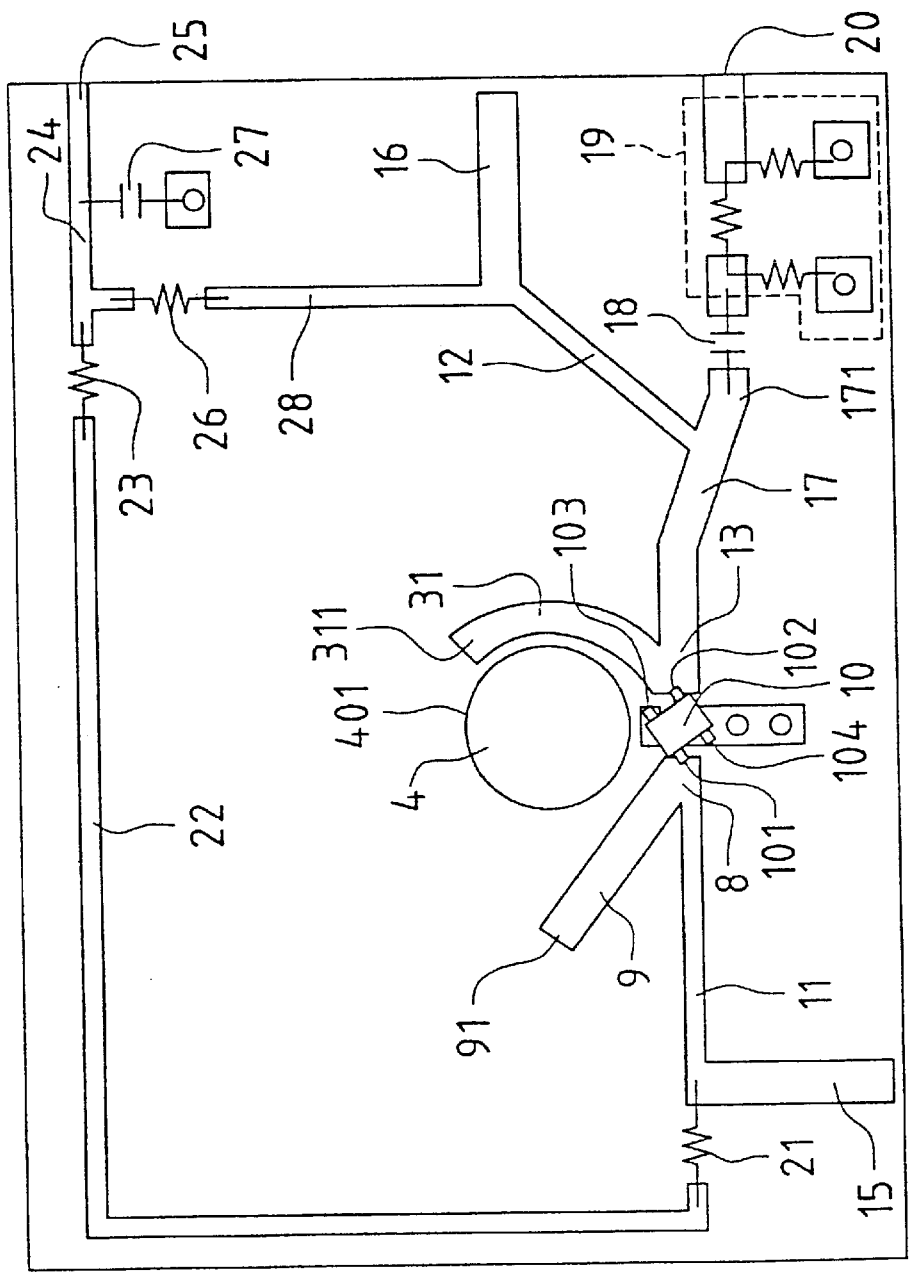
FIG. 2 illustrates a pattern and element arrangement of a dielectric resonance oscillation circuit according to a second embodiment of the present invention.

FIG. 2 illustrates a configuration of the dielectric resonance oscillation circuit according to the second embodiment of the present invention, in which the same reference characters as in FIG. 1 denote the same patterns or elements as in the first embodiment.

The configuration of the second embodiment is identical to that of the first embodiment except for the shape of the microstrip line connected to collector terminal 102 of transistor 10. Thus, this microstrip line connected to collector terminal 102 exclusively will be described, with the description of the other portions being not repeated.

The microstrip line 31 connected to collector terminal 102 is curved to follow a periphery 401 of dielectric resonator 4 of cylindrical shape. It has an end 311 open-circuited.

With such a configuration, the degree of coupling at high frequency between microstrip line 31 and dielectric resonator 4 of the second embodiment is improved compared to the degree of coupling at high frequency between microstrip line 14 and dielectric resonator 4 of the first embodiment.

Accordingly, the degree of feedback from collector terminal 102 to base terminal 101 as seen from transistor 10 increases. Thus, more stabilized oscillation of transistor 10 is ensured, and the oscillation level is further increased.

Such an increased degree of feedback from collector terminal 102 to base terminal 101, however, is accompanied by an increase of undesired phase noise. Accordingly, an optimum curved shape of microstrip line 31 is determined by trial and error such that the actual device exhibits characteristics as required.

As explained above, the dielectric resonance oscillation circuit according to the present invention is provided with a microstrip line connected to a signal input terminal of a transistor, a microstrip line connected to a signal output terminal of the transistor, and a dielectric resonator coupled with the microstrip lines at high frequency. Each of the microstrip lines is provided with a pattern that is branched off therefrom at an arbitrary angle. Accordingly, it becomes readily possible to configure a feedback type oscillation circuit, as the microstrip line connected to the signal output terminal is readily coupled at high frequency with the dielectric resonator and, also, the dielectric resonator is readily coupled at high frequency with the microstrip line connected to the signal input terminal.

Further, the pattern branched off from the microstrip line is provided with another pattern that is branched off from this pattern at an arbitrary angle. Accordingly, a resulting angle between the pattern branched off from the microstrip line and the pattern branched off from this pattern can be set to any angle according to the design requirement. Thus, it becomes possible to increase the degree of freedom for pattern designing.

Still further, the microstrip line connected to the signal input terminal of the transistor and the microstrip line connected to the signal output terminal of the transistor each have its end open-circuited and are configured to couple with the dielectric resonator at high frequency. Accordingly, a feedback path is formed through which the signal output from the signal output terminal of the transistor is sent via the dielectric resonator to the signal input terminal of the transistor. Thus, the transistor operates as a feedback type oscillation circuit, which enables a stable oscillation output to be obtained.

The microstrip line can be curved to follow the shape of the dielectric resonator. Thus, by making the curved shape of the microstrip line correspond to the shape of the dielectric resonator, the degree of coupling at high frequency between the microstrip line and the dielectric resonator is increased. Accordingly, it is possible to increase the degree of coupling with the dielectric resonator.

Further, a direct current is supplied at an end of the pattern branched off from the microstrip line. This pattern branched off from the microstrip line serves to prevent the DC supplying circuit from affecting the microstrip line. Thus, it becomes possible to facilitate supply of the power.

Still further, a stub hindering passage of an oscillation signal is provided at the end of the branched pattern described above. With the stub provided, the oscillation signal is prevented from leaking to the DC supplying circuit. Thus, it becomes possible to decrease the leakage level of the oscillation signal.

The present invention provides the dielectric resonance oscillation circuit having a pattern branched off from the microstrip line in the vicinity of the connect point between the microstrip line and the signal output terminal of the transistor. It is configured such that the oscillation signal is taken out from an end of the branched pattern, opposite to its branched end, serving as an outputting end. Accordingly, the pattern branched off from the microstrip line prevents the load connected to the outputting end from affecting the connect point of the microstrip line and the signal output terminal. Thus, it becomes possible to facilitate taking of the output signal.

Further, a capacitor is connected between the outputting end and the oscillation signal output terminal. The capacitor hinders passage of the DC component, and thus, the DC component is prevented from appearing at the outputting terminal. Still further, an attenuator is provided between the outputting end and the oscillation signal output terminal. The attenuator decreases the effect of the load connected to the oscillation signal output terminal on the outputting end, and therefore, the effect of the circuit connected to the outputting terminal on the oscillating operation can be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dielectric resonance oscillation circuit, comprising:
a transistor;
a first microstrip line having one end connected to a signal input terminal of said transistor;
a second microstrip line having one end connected to a signal output terminal of said transistor;
a dielectric resonator coupled with said first and second microstrip lines at high as frequency;
a first branched pattern having one end connected to said one end of said second microstrip line; and
a second branched pattern having one end connected to said first branched pattern, and branched off from said first branched pattern;
wherein said second branched pattern has another end receiving a direct-current bias.

2. A dielectric resonance oscillation circuit, comprising:
a transistor;
a first microstrip line having one end connected to a signal input terminal of said transistor;
a second microstrip line having one end connected to a signal output terminal of said transistor;
a dielectric resonator coupled with said first and second microstrip lines at high frequency;
a first branched pattern having one end connected to said one end of said second microstrip line;
a second branched pattern having one end connected to said first branched pattern, and branched off from said first branched pattern,
wherein said second branched pattern has another end receiving a direct-current bias; and
a stub connected to the another end of said second branched pattern for preventing passage of an oscillation signal.

3. A dielectric resonance oscillation circuit, comprising:
a transistor;
a first microstrip line having one end connected to a signal input terminal of said transistor;
a second microstrip line having one end connected to a signal output terminal of said transistor;
a dielectric resonator coupled with said first and second microstrip lines at high frequency;
a first branched pattern having one end connected to said one end of said second microstrip line; and
a second branched pattern having one end connected to said one end of said first microstrip line, wherein said second branched pattern has another end receiving a direct-current bias.

4. A dielectric resonance oscillation circuit, comprising:
a transistor;
a first microstrip line having one end connected to a signal input terminal of said transistor;

a second microstrip line having one end connected to a signal output terminal of said transistor;

a dielectric resonator coupled with said first and second microstrip lines at high frequency;

a first branched pattern having one end connected to said one end of said second microstrip line;

a second branched pattern having one end connected to said one end of said first microstrip line, wherein said second branched pattern has another end receiving a direct-current bias; and a stub connected to the another end of said second branched pattern for preventing passage of-an oscillation signal.

5. A dielectric resonance oscillation circuit, comprising:

a transistor;

a first microstrip line having one end connected to a signal input terminal of said transistor;

a second microstrip line having one end connected to a signal output terminal of said transistor;

a dielectric resonator coupled with said first and second microstrip lines at high frequency; and a first branched pattern having one end connected to said one end of said second microstrip line, wherein another end of said first branched pattern serves as an outputting end, further comprising:
  an oscillation signal output terminal; and
  an outputting portion connected between said outputting end and said oscillation signal output terminal, wherein said outputting portion includes an attenuator connected between said outputting end and said oscillation signal output terminal.

6. A dielectric resonance oscillation circuit, comprising:

a transistor;

a first microstrip line having one end connected to a signal input terminal of said transistor;

a second microstrip line having one end connected to a signal output terminal of said transistor;

a dielectric resonator coupled with said first and second microstrip lines at high frequency;

a first branched pattern having one end connected to said one end of said second microstrip line, wherein another end of said first branched pattern serves as an outputting end, further comprising:
  an oscillation signal output terminal; and
  an outputting portion connected between said outputting end and said oscillation signal output terminal, wherein said outputting portion includes a capacitor connected between said outputting end and said oscillation signal output terminal, wherein said outputting portion includes an attenuator connected between said outputting end and said oscillation signal output terminal.

* * * * *